US007926663B2

(12) United States Patent
Hosoi

(10) Patent No.: US 7,926,663 B2
(45) Date of Patent: Apr. 19, 2011

(54) SUBSTRATE STORAGE CONTAINER AND METHOD OF PRODUCING THE SAME

(75) Inventor: Masato Hosoi, Niigata (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 14 days.

(21) Appl. No.: 11/911,684

(22) PCT Filed: Apr. 21, 2006

(86) PCT No.: PCT/JP2006/308393
§ 371 (c)(1),
(2), (4) Date: Oct. 16, 2007

(87) PCT Pub. No.: WO2006/120866
PCT Pub. Date: Nov. 16, 2006

(65) Prior Publication Data
US 2009/0038984 A1 Feb. 12, 2009

(30) Foreign Application Priority Data

May 6, 2005 (JP) .................................. 2005-134876

(51) Int. Cl.
B65D 85/00 (2006.01)
(52) U.S. Cl. ...................... 206/711; 211/41.18; 206/710
(58) Field of Classification Search .................. 206/710, 206/711, 821, 501, 502, 628; 211/41.18; 248/188, 188.1, 188.3, 188.8, 615; 220/23.6, 220/23.8, 630, 628, 636
See application file for complete search history.

(56) References Cited

U.S. PATENT DOCUMENTS

| 4,277,198 | A | * | 7/1981 | Beckman ...................... 248/188 |
| 5,042,671 | A | | 8/1991 | Bischoff et al. |
| 5,853,214 | A | | 12/1998 | Babbs et al. |
| 5,921,516 | A | * | 7/1999 | Ho ............... 248/206.5 |
| 6,006,919 | A | | 12/1999 | Betsuyaku |
| 6,019,231 | A | * | 2/2000 | Kogure ...................... 211/41.18 |
| 6,216,874 | B1 | * | 4/2001 | Bores et al. ................... 206/711 |
| 6,382,419 | B1 | * | 5/2002 | Fujimori et al. .............. 206/711 |
| 6,428,729 | B1 | | 8/2002 | Bhatt et al. |
| 6,520,338 | B2 | * | 2/2003 | Bores et al. ................... 206/711 |
| 6,659,411 | B2 | * | 12/2003 | Araki .......................... 248/188.8 |
| 7,201,276 | B2 | * | 4/2007 | Burns et al. ................... 206/710 |
| 2003/0029765 | A1 | * | 2/2003 | Bhatt et al. .................... 206/711 |
| 2004/0124118 | A1 | | 7/2004 | Matsutori et al. |
| 2005/0109667 | A1 | * | 5/2005 | Burns et al. ................... 206/710 |
| 2005/0247594 | A1 | * | 11/2005 | Mimura et al. ............... 206/710 |

FOREIGN PATENT DOCUMENTS

JP 2002-299428 10/2002
WO 03/041937 5/2003

* cited by examiner

Primary Examiner — J. Gregory Pickett
Assistant Examiner — Andrew Perreault

(57) ABSTRACT

A substrate storage container that can be highly accurately positioned and produced at increased productivity, and a method of producing the substrate storage container are provided. The substrate container (10) comprises a container body (11) having an opening through which a substrate can be taken in and out thereof and a plurality of positioning members (16) arranged at a bottom of the container body (11). Each positioning member (16) includes a housing (17) and a plate-like member (18), the housing (17) having on one side thereof a pair of positioning slope faces (17c, 17d) and an opening on the other side thereof, the plate-like member (18) closing the opening. The container body (11) is insert-molded with the positioning members (16) used as inserts, and the positioning members (16) are integrally fixed to the container body (11).

15 Claims, 8 Drawing Sheets

SUBSTRATE STORAGE CONTAINER AND METHOD OF PRODUCING THE SAME

TECHNICAL FIELD

In a production line that produces semiconductor wafers, etc.: a substrate storage container is set at a predetermined position; a lid of the substrate storage container is automatically opened; the semiconductor wafers, etc., are taken out and processed; after the processing, the semiconductor wafers, etc., are again accommodated in the substrate storage container and are conveyed for the next process step; and, thereby, the semiconductor wafers, etc., are produced. The present invention relates to a substrate storage container that is used when a precision substrate such as a semiconductor wafer is produced, conveyed, and stored, and a method of producing the container, and more particularly, to a substrate storage container that has high precision in being positioned relative to a processing apparatus in a production line of semiconductor wafers, and a method of producing the container.

BACKGROUND ART

Conventionally, as shown in FIGS. 13(a) and 13(b), a substrate storage container includes a container body 1 that is provided with supporting ribs 2 that support semiconductor wafers, and a lid 4 that is detachably provided for an opening of the container body 1 and that has a sealing gasket 3 attached thereto, the lid 4 being provided with operation holes 5. The container body 1 is provided in a bottom portion thereof with a bottom plate 6 and in an upper portion thereof with a robotic flange 7. The bottom plate 6 may be provided on the bottom face thereof with positioning members 8 to position the substrate storage container at a predetermined position in a production line, a conveyer contact rail 9 to prevent the container from falling off which occurs when the container is conveyed on a conveyer, and the like. As shown in FIG. 13(c), the positioning members 8 of the substrate storage container each come into contact with a positioning pin P provided on a processing apparatus, etc., in a production line and, thereby, accurate positioning of the substrate storage container is executed. Thereafter, the lid 4 is opened and the semiconductor wafers are taken out of the container body 1 by an automatic machine, and the semiconductor wafers are processed. After the processing, the semiconductor wafers are stored in the container body 1 and the lid 4 is closed. In this manner, a substrate to fabricate highly integrated circuits is produced while micro dust is prevented from being adhered to the semiconductor wafer (see patent document 1).

For the above substrate storage container, the precision of the positioning by the positioning members is critically important for the productivity of the semiconductor wafers, etc. In the case where the positioning precision of the substrate storage container itself is insufficient, when the semiconductor wafers are taken out of or taken into the substrate storage container, the semiconductor wafers are broken, etc., because a hand unit of the automatic machine rubs or contacts the semiconductor wafers, resulting in the throughput of the semiconductor wafers being lowered.

In the above substrate storage container, the positioning members 8 are provided respectively at three positions on the bottom face of the bottom plate 6 so as to position the substrate storage container. The positioning members 8 each include a groove having a V-shaped cross section as shown in FIG. 13(c). The positioning pin P of the processing apparatus, etc., is guided along a slope of the groove that has a V-shaped cross section, so that the substrate storage container is adapted to be accurately positioned at a predetermined position.

To improve the positioning precision, it has been proposed that the positioning members of the substrate storage container be each provided with a centering section, into which the positioning pin fits, at the deepest portion of the groove having a V-shaped cross section or that the positioning be adapted to be executed accurately by the centering section by forming the centering section such that the centering section has an acuter angle than the angle of the slope of the groove having a V-shaped cross section (see patent document 2).

Patent document 1: Japanese Patent Application Laid-Open Publication No. 2005-064378

Patent document 2: Japanese Patent Application Laid-Open Publication No. 2002-353299

DISCLOSURE OF THE INVENTION

Problem to be Solved by the Invention

In the above conventional substrate storage container, the wall thickness of the positioning member 8 is extremely great as compared to the thickness of the bottom plate 6 of the container body 1 as shown in FIG. 13(c). This is because of the following reasons. For the positioning member, each of a pair of slope faces needs to have a specific length (about twice as long as the diameter of the positioning pin) to absorb the error of the mounting position such that the contact position is corrected by the centripetal effect generated by the slope faces and the positioning member can come into contact with the positioning pin at the deepest portion of the groove having a V-shaped cross section even when the contact position is somewhat displaced from the deepest portion. Therefore, the shape of the positioning member tends to have a great wall thickness. Furthermore, the weight of the substrate storage container having the semiconductor wafers accommodated therein is applied to the positioning members and thus the positioning members need to have sufficient strength to be able to withstand the weight and, therefore, the wall thickness of the positioning members can not be made very small. When the container body 1 and the positioning members 8 are resin-molded integrally, a disadvantage arises that the thick portions of the positioning members need a long time to be cooled and thus the production efficiency is degraded. Therefore, the production efficiency is improved by producing the positioning members in a separate resin-molding process and, when the container body is resin-molded, insert molding the container body with the positioning members being attached to the mold.

FIG. 14(a) is a view of the positioning member 8 in the case where the thickness thereof is great. For each of the positioning members 8, sink marks tend to be generated on both slope faces 8a and a top face 8b because the resin shrinkage occurs during a cooling process of the resin-molding. When it can be determined by visual observation that the sink marks are apparently generated, the positioning member 8 having the sink marks may be excluded as a defective work. However, it may be difficult to do so. In the case where the substrate storage container is positioned with high precision, when the positioning member 8 having the sink marks generated thereon is used, the positioning precision of the substrate storage container is degraded and a high quality processing process for a semiconductor wafer may be difficult to conduct.

As shown in FIG. 14(b), when the positioning member 8 is resin-molded, a technique known as gas assist molding may be used in which a cavity A is provided by injecting a high pressure gas from a gate portion 8c to reduce the thickness while the necessary strength is maintained. However, this technique has a disadvantage of increasing the production cost because special equipment is necessary. In the gas assist molding, since the positioning portion of the positioning member 8 is a V-shaped groove and thus the high pressure gas is dispersed toward the left and the right from the intersection of the slope faces 8a, the cavity A formed by the gas injection may be biased. However, in this method whether every portion has a necessary thickness can not be checked by visual observation from the appearance. Because a gas injection hole is opened in the gate portion 8c, cooling water or cleaning water flows from the gas injection hole into the cavity A of the positioning member 8 when the container body is cooled by water after the insert molding to improve the production efficiency of the substrate storage container or when the substrate storage container is cleaned to use the substrate storage container, but the work to remove the water trapped in the cavity A is troublesome. Therefore, this is a factor which lowers the production efficiency.

It can also be considered to execute the insert molding of the container body using positioning members of which the wall thickness is made uniform as inserts. However, because indented and protruded portions are formed on the contact faces of the container body and the positioning members, when molten resin is filled in a container body molding mold, the molten resin flows to detour around the positioning member or the flow of the molten resin is obstructed, whereby flow marks are formed or gas accumulation defects tend to be formed when the molten resin flows. Therefore, the throughput may be lowered, and thus this technique requires a further improvement to be made.

The present invention has been made in view of the above. Accordingly, it is an object of the present invention to provide a substrate storage container, and a method of producing thereof, the positioning of which can be executed with high precision and the production efficiency of which can be improved.

Means for Solving the Problem

The present invention has been made to solve the above problems. In accordance with an aspect of the present invention, a substrate storage container having an opening through which a substrate can be taken in and out thereof, comprises: a plurality of positioning members disposed on one side of the substrate storage container, wherein each of the plurality of positioning members includes: a housing having at least a pair of positioning slope faces on one side thereof and an opening on the other side thereof; and a plate-like member for closing the opening of the housing, and wherein the substrate storage container is formed by insert molding such that the positioning members are integrally fixed to the substrate storage container.

According to an embodiment of the present invention, the substrate storage container includes a container body having an opening for accommodating a substrate, and a lid for closing the opening of the container body, wherein the container body is integrally provided in a bottom portion thereof with the plurality of positioning members.

According to an embodiment of the present invention, the housing includes a flange portion extending laterally outward from the opening of the housing, a step portion formed inside the opening of the housing, and a supporting portion provided substantially at the center of the housing for supporting the plate-like member, wherein the plate-like member is fitted in the step portion.

According to an embodiment of the present invention, the housing has a hollow space of which an opening is closed by the plate-like member.

According to an embodiment of the present invention, an outer face of the plate-like member is flush with an inner face of the substrate storage container or an inner face of the container body.

According to an embodiment of the present invention, the housing is formed to have a uniform wall thickness the same as a wall thickness of a portion of the substrate storage container or the container body to which the positioning member is integrally fixed.

In accordance with another aspect of the present invention, a method of producing a substrate storage container having an opening through which a substrate can be taken in and out thereof, comprises the steps of: forming a plurality of positioning members each including a housing and a plate-like member and having a channel formed therein for molten resin; placing the positioning members in a container body molding mold for a container body of the substrate storage container while the positioning members each have the plate-like member fitted into an opening of the housing such that the plate-like member closes the opening of the housing; and injecting resin for the container body into the container body molding mold, to thereby mold the container body by insert molding such that the positioning members are integrally fixed to the container body.

According to an embodiment of the present invention, the housing includes a flange portion extending laterally outward from the opening of the housing, a step portion formed inside the opening, and a supporting portion provided substantially at the center of the housing for supporting the plate-like member, wherein the housing is constructed such that the plate-like member is fitted in the step portion, and wherein a cutout is formed on a face of the flange portion and a gap is formed between the flange portion and the plate-like member, whereby a channel for molten resin is defined.

Effect of the Invention

The substrate storage container of the present invention enables higher positioning precision with the position members without any extremely thick portion in the housing of each positioning member while obtaining necessary wall thickness thereof for required mechanical strength and preventing occurrence of sink marks during the resin-molding. The present invention has advantages such as that no cooling water and no cleaning water enters the inside of each positioning member because the opening of each positioning member is closed with the plate-like member.

A preferred embodiment of the present invention enables the positioning member to be structured to have sufficient strength and be integral with the container body because the molten resin that is to form the container body flows into the gap between the flange portion and the plate-like member and the resin that forms the container body is structured to bite the housing and the plate-like member when the container body is resin-molded.

The method of producing the substrate storage container according to the present invention can prevent occurrence of flow marks and gas accumulation defects because the molten resin flows through the channels formed in the positioning members and fills the channels, the positioning members are each integrally fixed to the container body by the resin, and the channels formed in the positioning members cause the molten resin to flow uniformly into and to fill the cavity of the container body molding mold, with the result that a substrate storage container having improved positioning precision by the positioning members can be provided.

According to a preferred embodiment of the present invention, the cutout provided on the face of the flange portion of the housing and the gap formed between the circumference of the plate-like member fitted in the step portion provided in the housing and the flange portion define the channel for the molten resin and, thereby, the molten resin flows without any obstruction to the flow of the molten resin by the positioning members, and thereby the present invention has an advantage that occurrence of flow marks and gas accumulation defects can be effectively suppressed.

BRIEF DESCRIPTION OF THE DRAWINGS

FIG. 8($b$) is a schematic cross-sectional view of the essential part after the molten resin is injected into the container body molding mold.

FIG. 13($b$) is a bottom view of the conventional substrate storage container; and FIG. 13($c$) is a view for explaining conventional positioning.

FIG. 14($b$) is a cross-sectional view of another example of the conventional positioning member that is formed using a gas assist method.

BEST MODE FOR CARRYING OUT THE INVENTION

Figure 1:
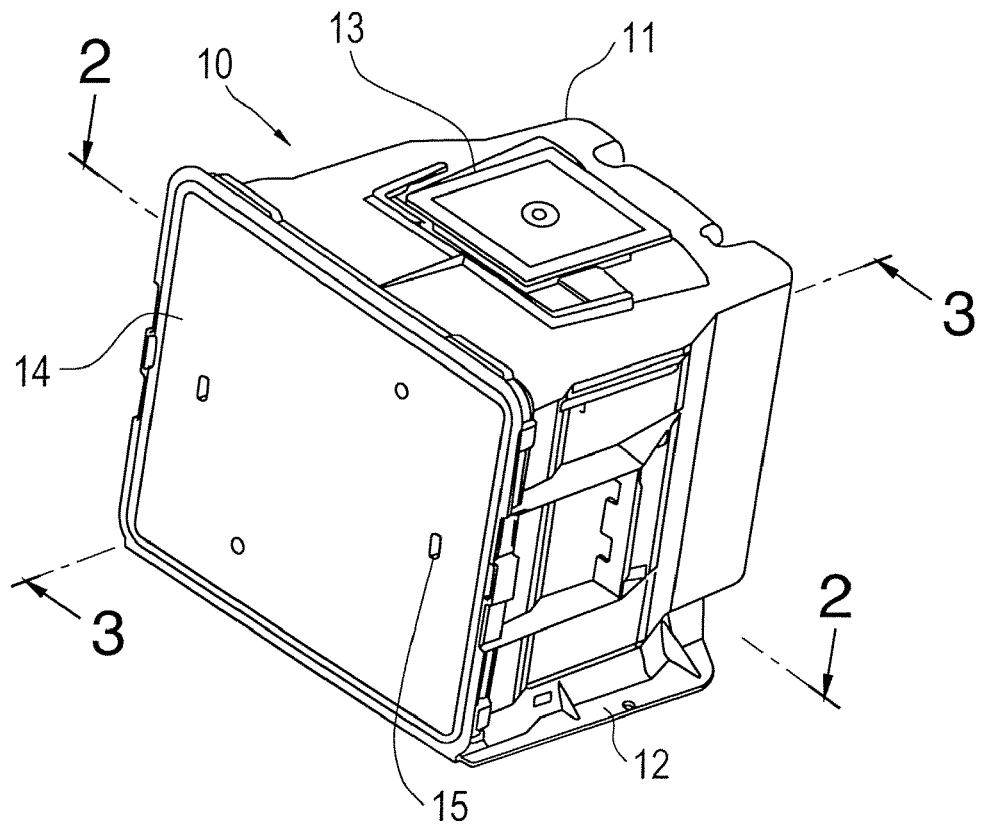
FIG. 1 is a perspective view of an embodiment of a substrate storage container according to the present invention.

A description will be given for embodiments of a substrate storage container and a method of producing the container according to the present invention referring to the drawings. The substrate storage container of the present invention is used when a precision substrate such as a semiconductor wafer, etc., is processed by an automatic machine, and is a substrate storage container that can be accurately positioned.

Figure 2:
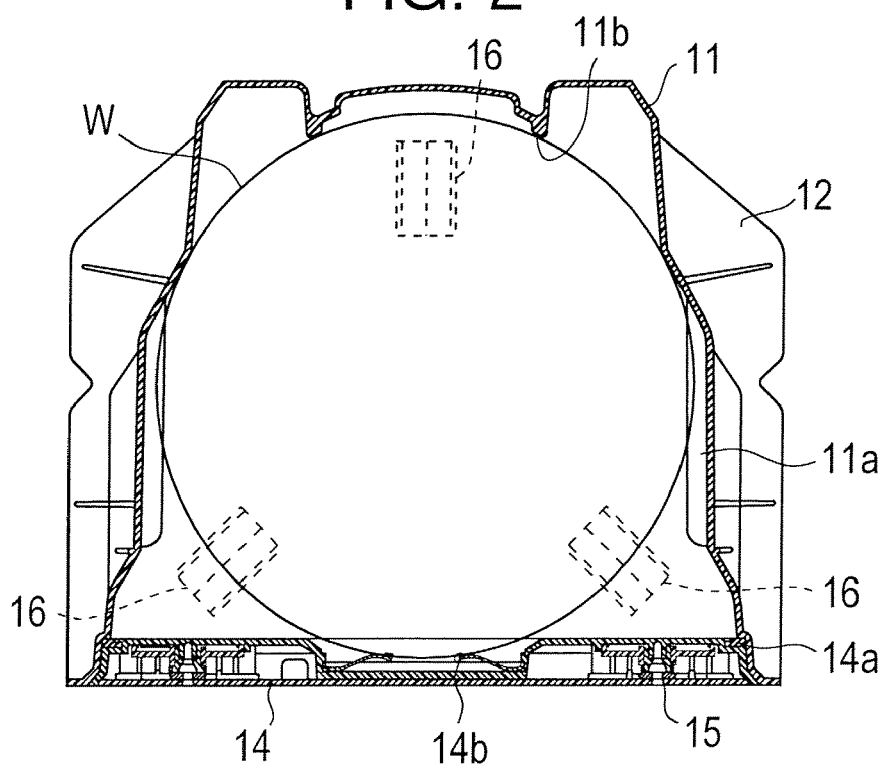
FIG. 2 is a horizontal cross-sectional view taken along line 2-2 of FIG. 1.
Figure 3:
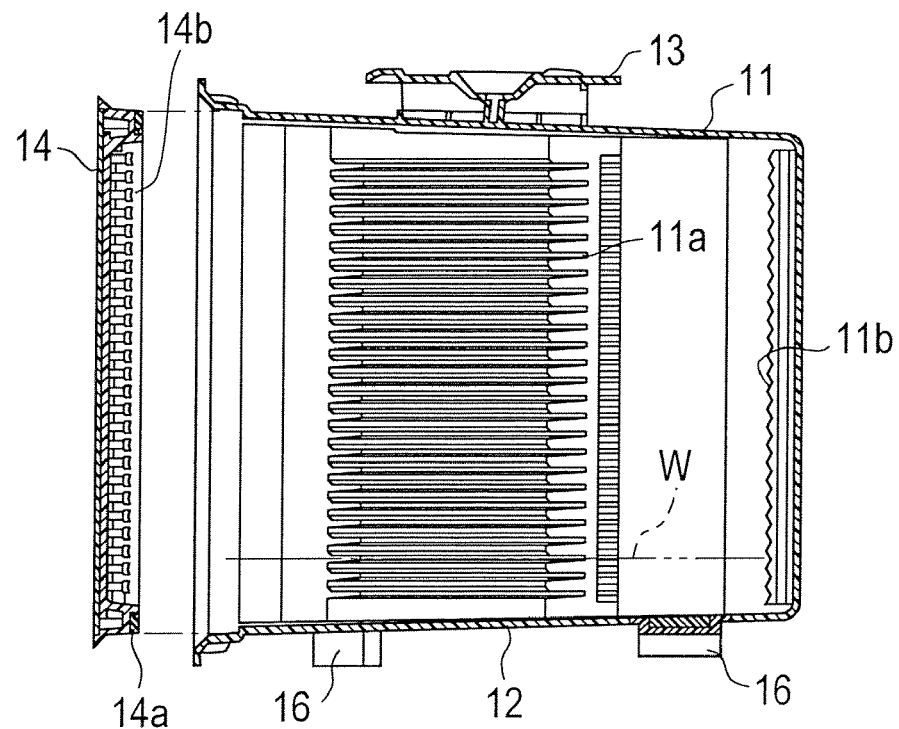
FIG. 3 is a vertical cross-sectional view taken along line 3-3 of FIG. 1.

A description will be given for an embodiment of a substrate storage container of the present invention referring to FIGS. 1 to 5. A substrate storage container 10 includes a container body 11 and a lid 14 that is detachably provided for an opening of the container body 11. The lid 14 is provided with operation holes 15 and has a sealing gasket 14$a$ attached thereto. The container body 11 is provided with supporting ribs 11$a$ that support semiconductor wafers W and grooves 11$b$ that receive the semiconductor wafers W. The lid 14 is provided with holding members 14$b$ that hold the semiconductor wafers W using a predetermined elastic force. The container body 11 is provided at the bottom thereof with a bottom plate 12. The container body 11 is provided in the upper portion thereof with a robotic flange 13. As shown in FIGS. 2 and 3, the bottom plate 12 is provided with positioning members 16 respectively at three positions thereof so that the positioning members 16 will guide respective positioning pins of a processing apparatus, etc., that processes the semiconductor wafers W, and hold those pins while being in contact with those pins. The positioning pins are respectively guided by the positioning members 16 and are respectively fitted at predetermined positions. Thereby, the substrate storage container 10 is accurately positioned at a predetermined position relative to the processing apparatus, etc. The construction of the container body 11 is not limited to the above.

Figure 4:
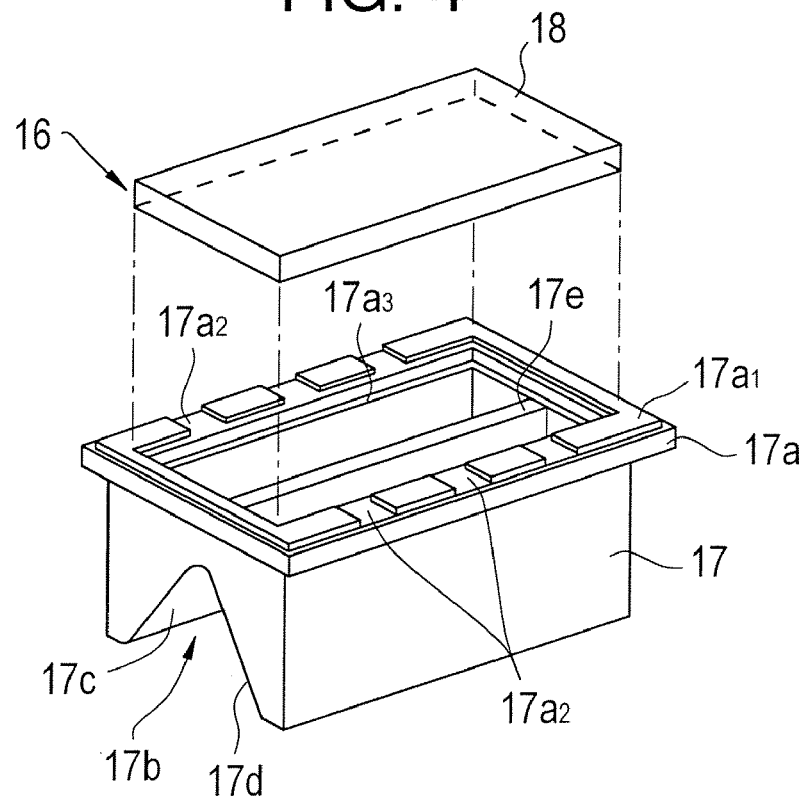
FIG. 4 is an exploded perspective view of a positioning member in the embodiment of FIG. 1.
Figure 5:
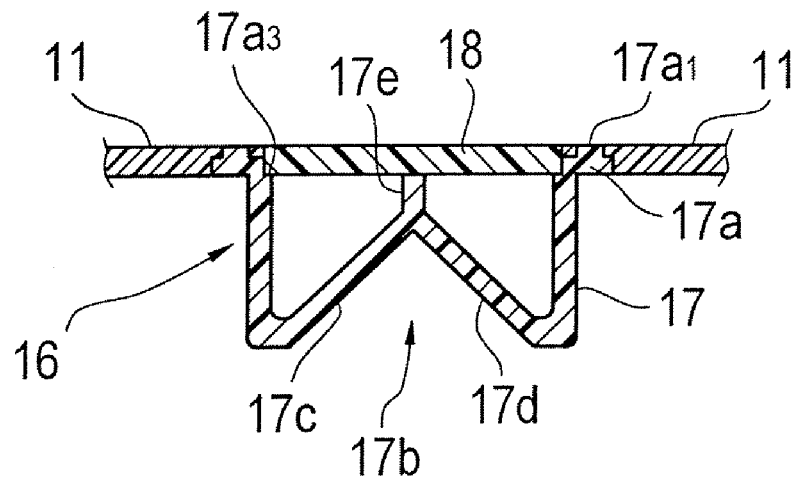
FIG. 5 is a cross-sectional view of the positioning member in the embodiment of FIG. 1.

The positioning members 16 are produced in advance in a resin-molding process separate from that of the container body 11 of the substrate storage container 10, and the container body 11 is formed using insert molding by placing the positioning members 16 in a container body molding mold as inserts. As shown in FIGS. 4 and 5, the positioning member 16 includes a housing 17 that is formed to have a hollow space therein and that has an opening at one end and a plate-like member 18 that closes the opening of the housing 17. The outer shell of the housing 17 is formed to have a substantially uniform thickness and is provided at the one end with a flange portion 17$a$ having a rectangular-frame shape around the opening of the housing 17 extending laterally outward (horizontally in FIGS. 4 and 5). The housing 17 includes a V-shaped groove 17$b$ that is formed by a pair of slope faces 17$c$ and 17$d$, on the opposite side in a vertical direction of the housing 17, that is, on the bottom face thereof so as to guide the positioning pin.

The housing 17 of the positioning member 16 is provided with a protruded part 17$a_1$ on the top face of the flange portion 17$a$ and a step portion 17$a_3$ on the inner circumference portion of the flange portion 17$a$. The protruded part 17$a_1$ on the top face of the flange portion 17$a$ is provided with cutouts 17$a_2$ each spaced in the circumferential direction of the flange portion 17$a$, and the cutouts 17$a_2$ are symmetrically formed on the protruded part 17$a_1$ on the facing two sides of the flange portion 17$a$ such that the cutouts are facing each other. The housing 17 of the positioning member 16 is provided inside thereof with a supporting member 17$e$ that protrudes from an inner end of the V-shaped groove 17$b$ toward the opening. The supporting member 17$e$ is formed substantially in the center inside the housing 17. When the plate-like member 18 is mounted on the step portion 17$a_3$, the center of the plate-like member 18 comes into contact with the supporting portion 17$e$. In the case where positioning by the V-shaped groove 17$b$ is executed, the supporting portion 17$e$ supports the housing 17 with the mechanical strength of the degree that the housing 17 is not broken when the positioning pin comes into contact with the V-shaped groove 17$b$. Therefore, the thickness of the housing 17 can be made as thin as the thickness of the container body 11.

Before the injection of the resin to form the container body 11, for the positioning member 16, a gap 21a is formed between the protruded part $17a_1$ of the flange portion 17a and the outer circumference of the plate-like member 18 mounted on the step portion $17a_3$. The gap 21a around the outer circumference of the plate-like member 18 and the cutouts $17a_2$ in the protruded part $17a_1$ on the top face of the flange portion 17a form a channel for the molten resin for the resin-molding of the container body 11. Due to this channel, the molten resin reaches every part of the cavity of the container body molding mold without obstructing to the flow of the molten resin even when the positioning members 16 are present and these gaps are filled with the resin, so that the positioning members 16 are firmly fixed to the container body 11. The top face of the protruded part $17a_1$ of the flange portion 17a and the top face of the plate-like member 18 mounted on the step portion $17a_3$ are flush with the inner face of the container body 11. For the positioning member 16, the positioning portion may be configured by three or more slope faces instead of the pair of slope faces.

Figure 6:
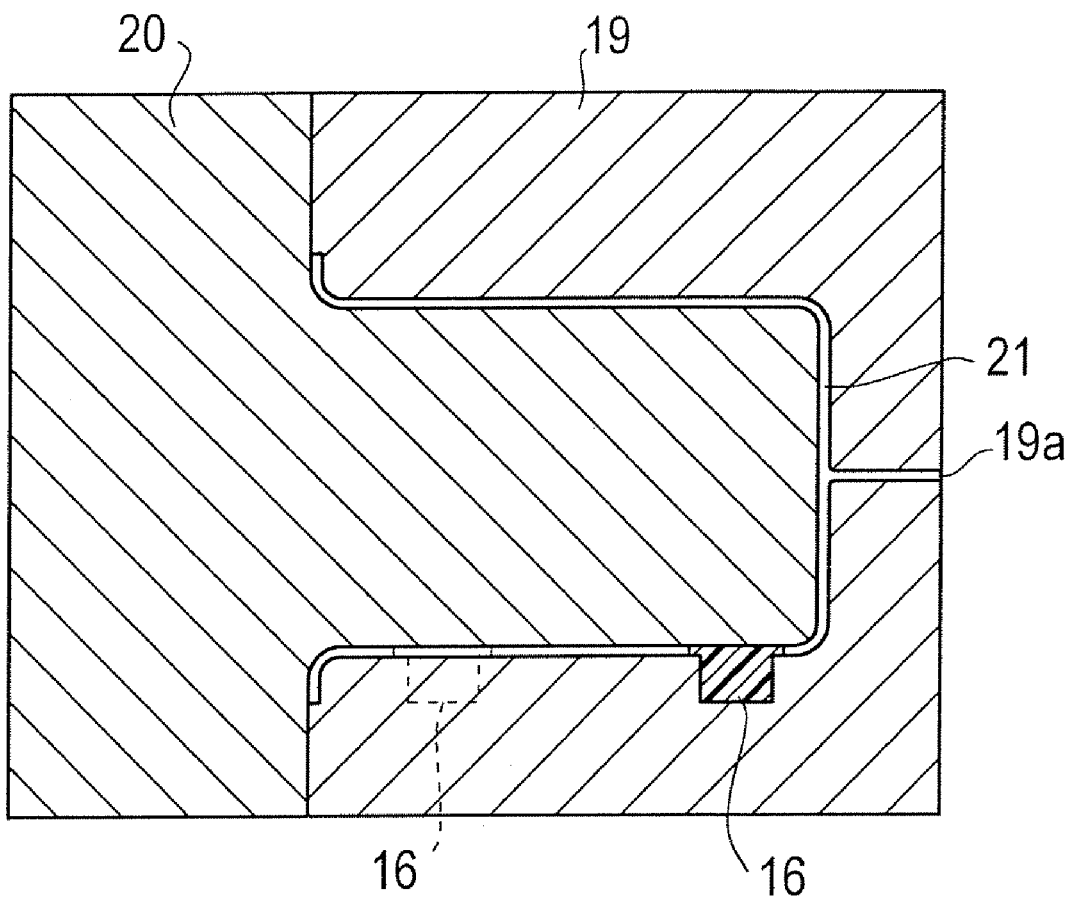
FIG. 6 is a schematic cross-sectional view of a container body molding mold for explaining an embodiment of a production method of the substrate storage container according to the present invention.
Figure 7:
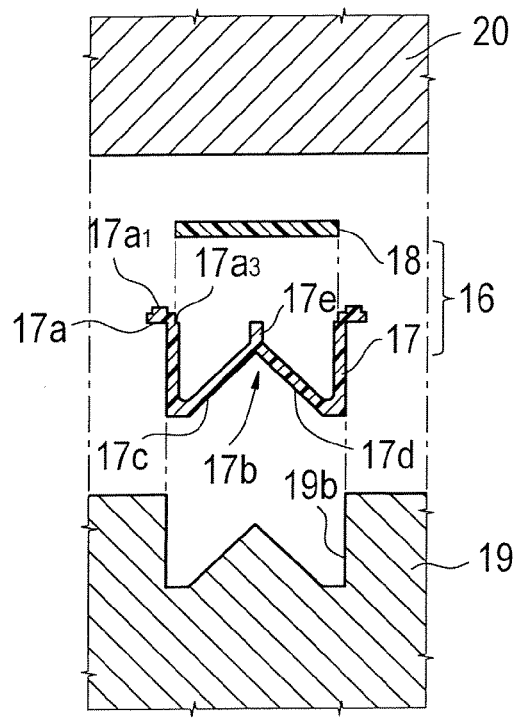
FIG. 7 is a schematic exploded cross-sectional view of the container body molding mold and the positioning member that serve as the essential part in a production process of the substrate storage container.

A description will now be given for a method of producing the substrate storage container of the above embodiment of the present invention referring to FIGS. 6 to 9. FIG. 6 is a schematic cross-sectional view of a container body molding mold to resin-mold the container body 11 of the substrate storage container. FIGS. 7 to 9 are cross-sectional views of the essential part in a producing process. As shown in FIG. 6, the container body molding mold includes a cavity block 19 and a core block 20 and the cavity block 19 is provided with a gate hole 19a to inject molten resin therethrough. When the container body 11 is injection-molded, the positioning members 16 formed separately are attached to the cavity block 19 as inserts and the core block 20 is set, so that a cavity 21 is formed between the cavity block 19 and the core block 20. Thereafter, the molten resin is injected from the gate hole 19a and fills the cavity 21, whereby the container body 11 into which the positioning members 16 are integrated is formed by insert molding.

The housing 17 of the positioning member 16 is formed by injection molding the molten resin that is a resin material the same as that of the container body 11 such as, for example, polycarbonate, polybutyleneterephthalate, polyetheretherketone, cycloolefinpolymer, polyetherimide, polyethersulphone or the like that has an excellent abrasion resistance. Similarly, the plate-like member 18 is formed by molding a resin material such as polycarbonate, polybutyleneterephthalate, polyetheretherketone, cycloolefinpolymer, polyetherimide, polyethersulphone or the like. The resin material of the positioning member 16 may be adapted, when necessary, to prevent charging of static electricity caused by friction between the substrate storage container and an automatic conveying apparatus, by providing electric conductivity for the resin material by including carbon fibers or metal fibers in the resin material. The material of the housing 17 and the plate-like member 18 is not limited to the above.

As shown in FIG. 7, the cavity block 19 is formed with concave fitting portions 19b into each of which a portion lower than the flange portion 17a of the housing 17 of the positioning member 16 is fitted and accommodated, so that the housing 17 is attached to the concave fitting portion 19b. The plate-like member 18 is placed on the step portion $17a_3$ of the housing 17, whereby the opening of the housing 17 of the positioning member 16 is closed. The plate-like member 18 is also supported by the supporting portion 17e formed in the center of the housing 17.

Figure 8A:
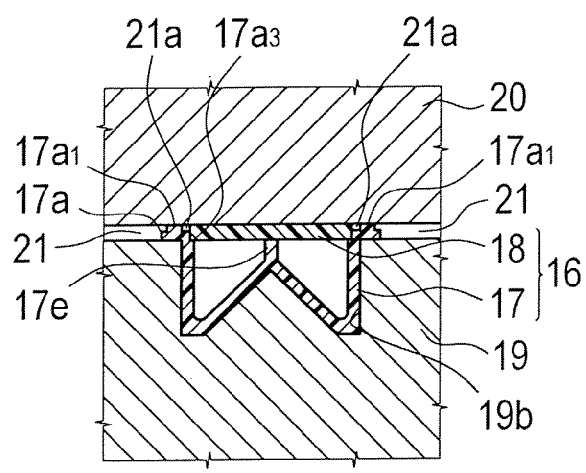
FIG. 8($a$) is a schematic cross-sectional view of the essential part before molten resin is injected into the container body molding mold.
Figure 9:
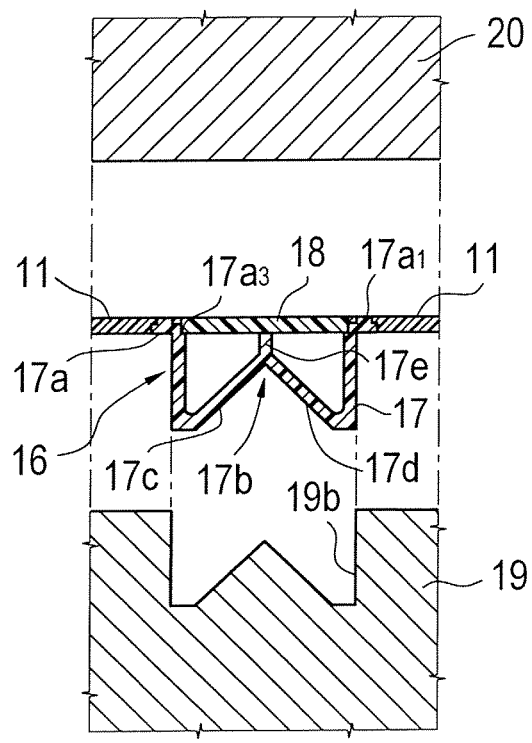
FIG. 9 is a schematic cross-sectional view of the essential part when the formed container body is separated from the container body molding mold and is taken out therefrom.

As shown in FIG. 8(a), the core block 20 is moved to and inserted into the cavity block 19 to form the cavity 21 to form the container body 11. The core block 20 contacts each plate-like member 18 and fixes each positioning member 16. In this state, the gap 21a is formed between the plate-like member 18 and the protruded part $17a_1$ and the gap 21a is formed around the entire circumference of the plate-like member 18. The gap 21a communicates with the cavity 21 through the cutouts $17a_2$ formed on the protruded part $17a_1$ at predetermined intervals.

Figure 8B:
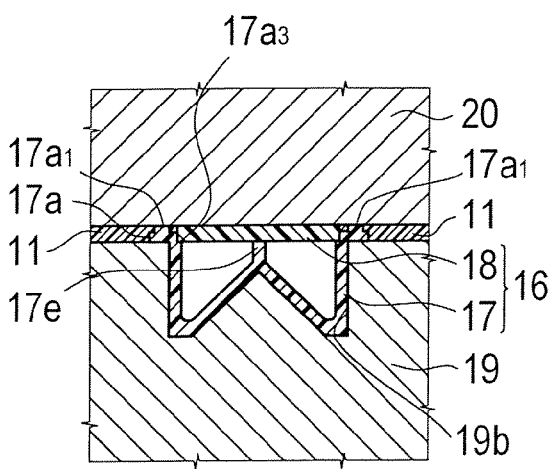

After the core block 20 is set on the cavity block 19, the molten resin is injected by an injecting apparatus (not shown) through the gate hole 19a and the cavity 21 is filled with the molten resin as shown in FIG. 8(b). The molten resin fills the gaps 21a around the plate-like members 18 and the cutouts $17a_2$ on the flange portions 17a of the positioning members 16. After cooling the molten resin, the container body 11 including the positioning members 16 that have the hollow space and are integrally fixed firmly to the container body 11 is insert molded. After the molten resin that fills the cavity 21 has been cured through the cooling process, the cavity block 19 and the core block 20 are separated from each other as shown in FIG. 9 and the container body 11 is taken out.

Regarding the positioning member 16, the cutouts $17a_2$ are formed on the flange portion 17a of the housing 17 and the gap 21a is formed around the outer circumference of the plate-like member 18 and the cutouts $17a_2$ are respectively formed at positions facing each other, whereby when the molten resin is injected, the molten resin flows such that the molten resin passes the positioning member 16 via the cutouts $17a_2$ and the gap 21a as the channel therefor. Therefore, the equilibrium of the flow and the balance of the flow rate of the molten resin into the cavity 21 are not extremely worsened by the positioning members 16 and the positioning members 16 do not obstruct the flow of the molten resin, with the result that occurrence of flow marks and gas accumulation defects to the container body 11 can be prevented.

As explained above, the method of producing the substrate storage container in the embodiment includes the steps of: resin-molding for forming the positioning members 16 that each include the housing 17 having a substantially uniform wall thickness and a plate-like member 18 and that is provided with the channel for the molten resin formed by the cutouts $17a_2$ and the gap 21a; placing the positioning members 16 in the cavity block 19 (the container body molding mold) for the substrate storage container 10 while the plate-like members 18 are each fitted in the housing 17 such that the plate-like member 18 closes the opening of the housing 17; and attaching the core block 20 to the cavity block 19, injecting the molten resin into the cavity 21, and forming the container body 11 by insert molding such that the positioning members 16 and the container body 11 are integrally joined to each other. Since deformation caused by non-uniform shrinkage is prevented by making the wall thickness of the housing 17 of each positioning member 16 substantially uniform, the container body 11 is insert molded using as inserts the positioning members 16 that have been resin-molded in advance with high precision. Therefore, the deformation of the positioning members 16 caused by thermal shrinkage is prevented and the slope faces 17c and 17d that form the V-shaped groove 17b are not deformed. Accordingly, the substrate storage container of which positioning by the positioning members 16 can be achieved with extremely high precision can be produced.

Since the channel for the molten resin is formed by the cutouts $17a_2$ and the gap 21a in each positioning member 16, no flow marks and no gas accumulation defects tend to occur to the molded container body 11, resulting in the throughput thereof being excellent. In addition, since unnecessary holes are not present in the positioning members 16 and the wall thickness of the positioning members 16 is small, the cooling process is shortened and thus the time necessary for the manufacture thereof can be reduced. Because no cooling water and no cleaning water flows into the positioning members 16, the present invention has an advantage that the production efficiency of the substrate storage container, or semiconductor wafers or semiconductor devices processed using the substrate storage container can be improved.

Figure 10:
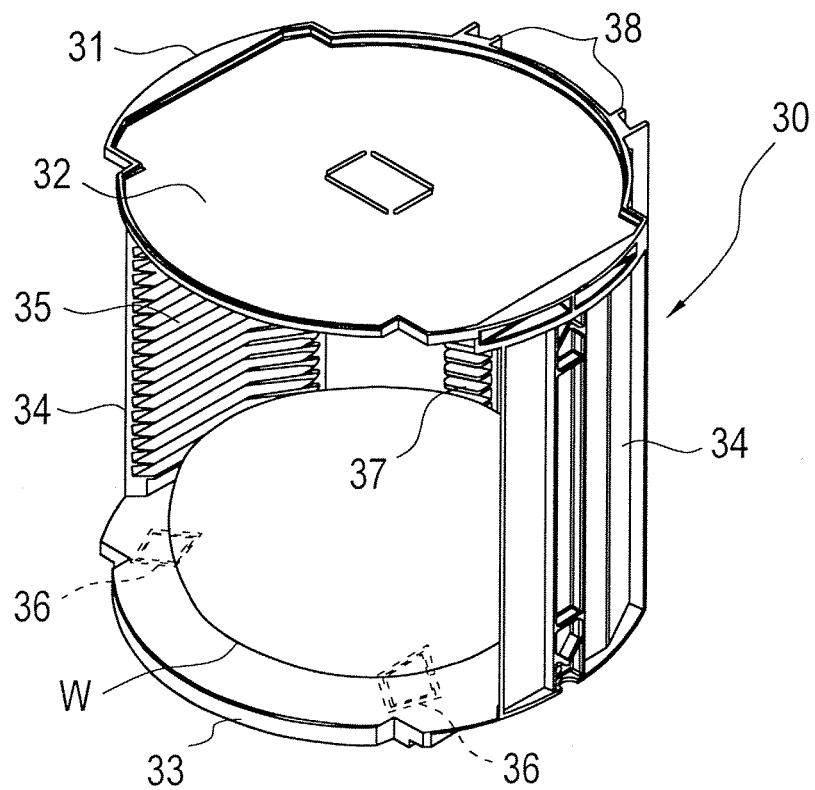
FIG. 10 is a perspective view of another embodiment of the substrate storage container according to the present invention.
Figure 11:
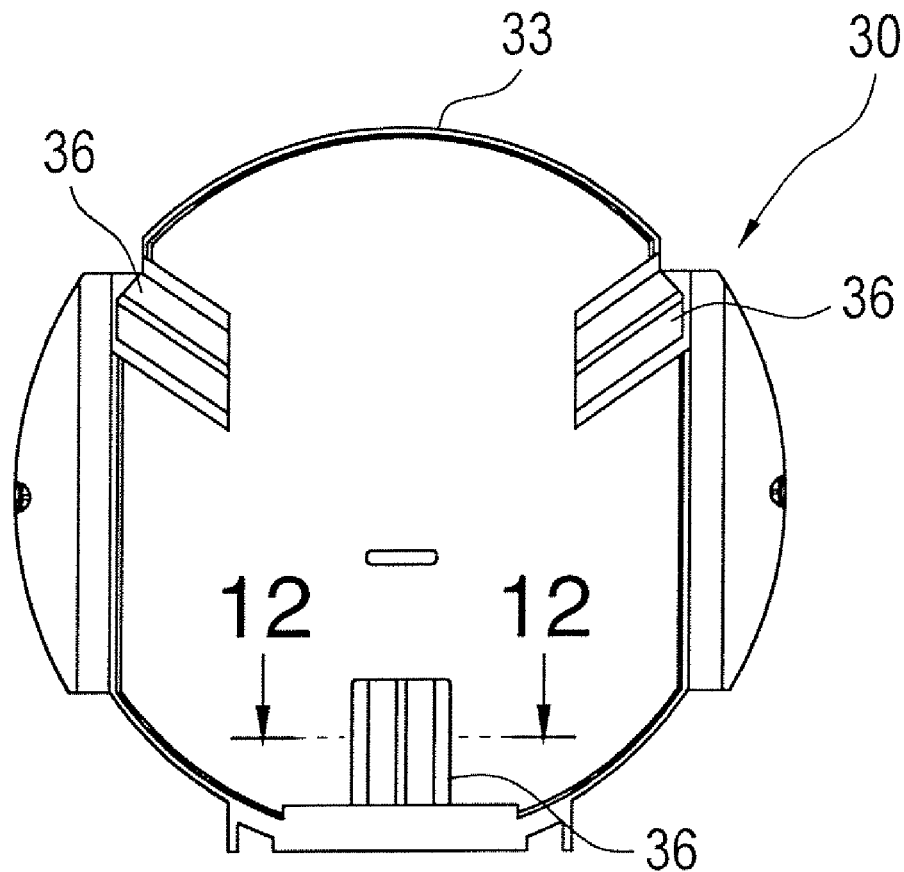
FIG. 11 is a bottom view of the substrate storage container in the embodiment of FIG. 10.
Figure 12:
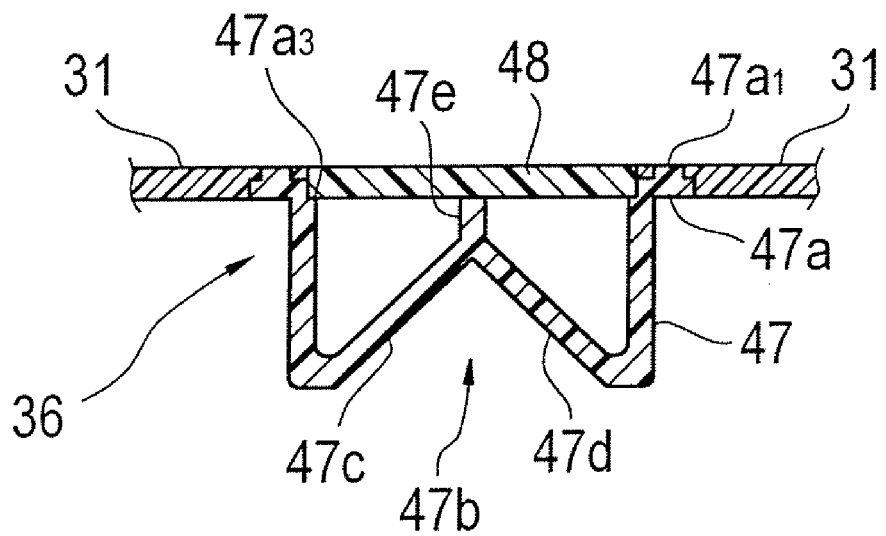
FIG. 12 is a cross-sectional view taken along line 12-12 of FIG. 11.
Figure 13A:
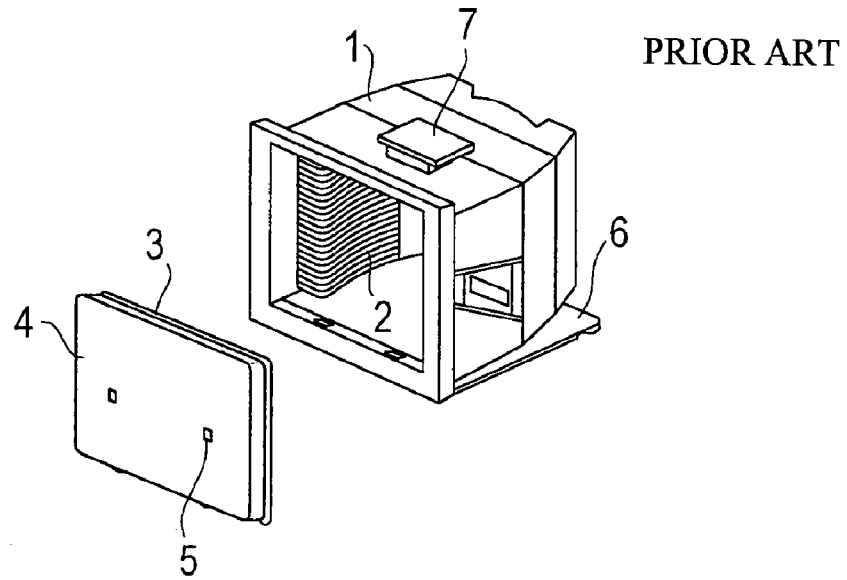
FIG. 13($a$) is a perspective view of a conventional substrate storage container.
Figure 13B:
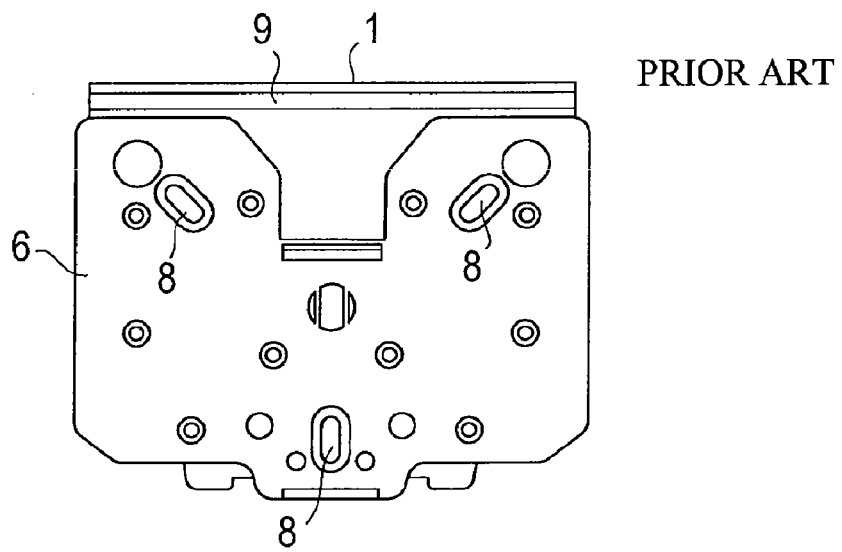
Figure 13C:
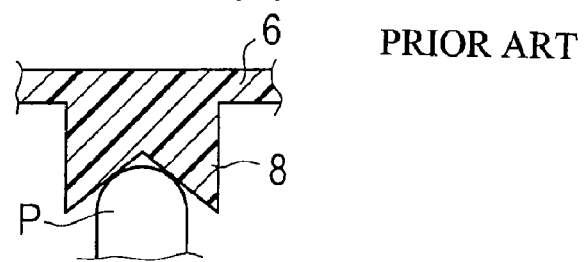
Figure 14A:
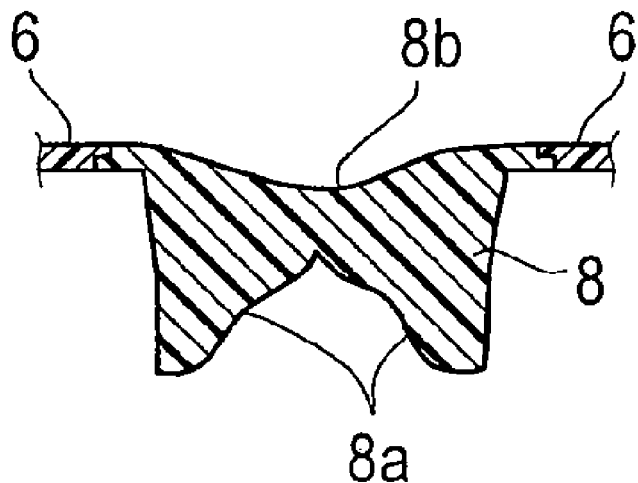
FIG. 14($a$) is a cross-sectional view of an example of a conventional positioning member.
Figure 14B:
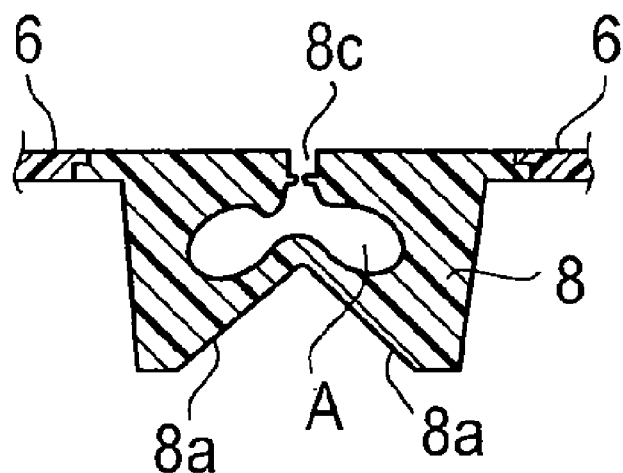

A description will now be given for another embodiment of the substrate storage container of the present invention referring to FIGS. 10 to 12. In the embodiment of FIGS. 10 to 12, the substrate storage container is configured as a cassette for holding semiconductor wafers. In a cassette 30 of the embodiment, a container body 31 includes an upper end wall 32 and a lower end wall 33 each having a substantially disc shape, and a pair of side walls 34 that each connect the upper end wall 32 and the lower end wall 33 and that each have a supporting portion 35 that supports semiconductor wafers W formed on the inner wall thereof such that the supporting portions 35 face each other. An opening for taking in and out the semiconductor wafers W therethrough is formed at the front end of the support portions 35. Furthermore, the container body 31 is provided on the side thereof opposite from the opening with rear supports 38, which are each formed with supporting grooves 37 that respectively regulate the semiconductor wafers W. In the cassette 30 of this embodiment, the container body 31 is provided at three positions on the bottom of the lower end wall 33 thereof with positioning members 36 the same as those of the previous embodiment, respectively. These positioning members 36 are integrated with the lower end wall 33 of the container body 31 using the same method of producing as that of the previous embodiment.

The positioning members 36 are produced using a separate resin-molding process. The container body 31 is formed using insert molding with the positioning members 36 disposed in the container body molding mold as inserts. As shown in FIG. 12, the positioning member 36 includes a housing 47 and a plate-like member 48 that closes an opening of the housing 47. In this embodiment, two front ones of the positioning members 36 each have a substantially parallelogram shape and the rear one thereof has a rectangular shape in plan view. However, the positioning members 36 each have substantially the same configuration as that of the positioning members 16 in the previous embodiment and, therefore, a detailed description thereof is omitted. In the drawings, reference numerals 47a and 47b respectively denote a flange portion and a V-shaped groove, reference numerals 47c and 47d respectively denote slope faces, a reference numeral 47e denotes a supporting portion, and reference numerals $47a_1$ and $47a_3$ respectively denote a protruded part and a step portion. This embodiment can achieve the same effect as that of the previous embodiment.

Though the container body of the substrate storage container according to each of the above embodiments is provided with the positioning members respectively at three positions, the arrangement of the positioning members is not limited to the above. The substrate storage container may be formed with a guiding groove or a guiding rail when necessary in association with an automatic conveying machine, an automatic machine, or a processing machine provided for a semiconductor production line. In the method of producing the above substrate storage container, the cavity block may have a dividable configuration, and a gas assist method or foaming may be combined for the injection molding of the molten resin.

INDUSTRIAL APPLICABILITY

As described above, a substrate storage container and a method of producing the substrate storage container according to the present invention are useful for producing, conveying, and storing precision substrates such as semiconductor wafers, and are especially suitable for positioning with high precision the substrate storage container and processing precision substrates such as semiconductor wafers.

Explanation of Reference Numerals

1 Container body
2 Supporting rib
3 Sealing gasket
4 Housing
5 Operation hole
6 Bottom plate
7 Robotic flange
8 Positioning member
8a Slope face
8b Top face
8c Gate portion
10 Substrate storage container
11 Container body
11a Supporting rib
11b Groove
12 Bottom plate
13 Robotic flange
14 Housing
14a Seal gasket
14b Holding member
15 Operation hole
16 Positioning member
17 Housing
17a Flange portion
$17a_1$ Protruded part
$17a_2$ Cutout
$17a_3$ Step portion
17b V-shaped groove
17c, 17d Slope face
17e Supporting portion
18 Plate-like member
19 Cavity block
19a Gate hole
19b Concave fitting portion
20 Core block
21 Cavity
21a Gap
30 Substrate storage container
31 Container body
32 Upper end wall
33 Lower end wall
34 Side wall
35 Supporting portion
36 Positioning member
37 Supporting groove
38 Rear support
47 Housing
47a Flange portion
$47a_1$ Protruded part
$47a_3$ Step portion
47b V-shaped groove 47c, 47d Slope face
47e Supporting portion
48 Plate-like member
A Cavity
P Positioning pin
W Semiconductor wafer

The invention claimed is:

1. A substrate storage container having an opening through which a substrate can be taken in and out thereof; comprising:
a plurality of positioning members disposed on an exterior side of the substrate storage container and of a configuration to guide robotic positioning members to enable robotic movement of the substitute storage container, wherein the substrate storage container and the plurality of positioning members are formed of a resin and are integrally fixed together by resin from the molding of the substrate storage container and each of the plurality of positioning members includes:
a positioning housing with a hollow space therein and an opening at one end thereof and having at least a pair of positioning slope faces on one side thereof and located on the exterior side of the substrate storage container, and the positioning housing opening on an interior side thereof adjacent to an inside of the substrate storage container; and
a plate member for closing the opening of the positioning housing, and wherein
the substrate storage container is formed such that the positioning members are integrally fixed to the substrate storage container as a solid flush one piece structure on the interior side of the substrate storage container without any opening through the positioning members into the substrate storage container.

2. The substrate storage container according to claim 1, further comprising:
a container body having an opening for accommodating the substrate; and
a lid for closing the opening of the container body, wherein the container body is integrally provided at an exterior bottom portion thereof with the plurality of positioning members.

3. The substrate storage container according to claim 1, wherein the positioning housing includes:
a flange portion extending laterally outward from the opening of the positioning housing;
a step portion formed inside the opening of the positioning housing; and
a supporting portion provided substantially at the center of the positioning housing for supporting the plate member, wherein
the plate member is fitted in the step portion to be flush with the interior side of the substrate storage container.

4. The substrate storage container according to claim 1, wherein an outer face of the plate member is flush with an interior side of the substrate storage container.

5. The substrate storage container according to claim 2, wherein an outer face of the plate member is flush with an interior side of the container body.

6. The substrate storage container according to claim 1, wherein the positioning housing is formed to have a uniform wall thickness the same as a wall thickness of a portion of the substrate storage container to which the positioning member is integrally fixed.

7. The substrate storage container according to claim 2, wherein the positioning housing is formed to have a uniform wall thickness the same as a wall thickness of a portion of the container body to which the positioning member is integrally fixed.

8. The substrate storage container according to claim 2, wherein the positioning housing includes:
a flange portion extending laterally outward from the opening of the positioning housing;
a step portion formed inside the opening of the positioning housing; and
a supporting portion provided substantially at the center of the positioning housing for supporting the plate member, wherein
the plate member is fitted in the step portion.

9. A resin substrate storage container for semiconductor wafers, comprising:
a hollow container body with an opening through which a substrate can be inserted and removed therefrom;
a plurality of supporting ribs spaced from each other and provided within the container body;
an interior surface opposite from the opening with grooves respectively corresponding in position to the supporting ribs for receiving a portion of an edge of the substrate;
a lid removably connected to close the opening with elastic force holding members respectively corresponding in position to the supporting ribs for receiving another portion of the edge of the substrate; and
a plurality of positioning members of resin disposed on one exterior side of the container body container and of a configuration to guide positioning members to enable robotic movement of the substitute storage container, wherein
each of the plurality of positioning members includes:
a positioning housing with a hollow space therein and an opening at one end thereof and having at least a pair of positioning slope faces on an other end thereof and located on an outer side of the substrate storage container and the positioning housing opening located adjacent to the interior surface of the substrate storage container; and
a plate member for closing the opening of the positioning housing to be flush with an adjacent inside surface of the container body, and wherein
the container body is formed such that the positioning members are integrally fixed to the substrate storage container and only project outward from the exterior side of the substrate storage container with the plate member and the adjacent interior surface are integrally fixed together with resin of the container body.

10. The substrate storage container according to claim 9, wherein the hollow container body is integrally provided at a bottom portion thereof with the plurality of positioning members.

11. The substrate storage container according to claim 10, wherein the hollow container body includes:
a flange portion extending laterally outward from the opening of the hollow container body; and
a step portion formed inside the opening of the container body;
wherein the lid is removably fitted in the step portion.

12. the substrate storage container according to claim 10, wherein an outer face of the lid is flush with an inner face of the hollow container body.

13. The substrate storage container according to claim 10, wherein the hollow container body is formed to have a uniform wall thickness including a wall thickness of a portion of the container body to which the positioning members are integrally fixed thereto.

14. The substrate storage container according to claim 10, wherein a robotic flange, configured to interface with a processing apparatus on a production line, is provided on an outer surface opposite the plurality of positioning members.

15. The substrate storage container according to claim 13, wherein the plurality of positioning members have a lower V-surface projecting from an exterior bottom surface of the hollow container body and the interior surface of the container body to which the positioning members are integrally fixed, does not project into the hollow container body and is flat with no openings adjacent the positioning members.

\* \* \* \* \*